(12) United States Patent
Carpenter

(10) Patent No.: US 6,928,718 B2
(45) Date of Patent: Aug. 16, 2005

(54) METHOD FOR ARRAY PROCESSING OF SURFACE ACOUSTIC WAVE DEVICES

(75) Inventor: Charles Carpenter, Orlando, FL (US)

(73) Assignee: Sawtekk, Inc., Orlando, FL (US)

( * ) Notice: Subject to any disclaimer, the term of this patent is extended or adjusted under 35 U.S.C. 154(b) by 334 days.

(21) Appl. No.: 09/864,918

(22) Filed: May 24, 2001

(65) Prior Publication Data

US 2002/0008438 A1 Jan. 24, 2002

Related U.S. Application Data

(60) Provisional application No. 60/209,692, filed on Jun. 6, 2000.

(51) Int. Cl.[7] .............................................. H04R 31/00
(52) U.S. Cl. ......................... 29/594; 29/609.1; 29/834; 29/835; 156/250; 156/257; 156/277; 310/313; 310/320; 310/366; 333/150; 333/187; 333/193; 333/195; 333/196
(58) Field of Search ............................... 29/25.35, 594, 29/595, 609.1, 834, 835; 310/313, 320, 366; 333/150, 187, 193, 195, 196; 156/250, 257, 277

(56) References Cited

U.S. PATENT DOCUMENTS

| | | |
|---|---|---|
| 4,965,227 A | 10/1990 | Chang et al. |
| 5,252,882 A | 10/1993 | Yatsuda |
| 5,332,463 A | 7/1994 | Eberlein et al. |
| 5,458,716 A | 10/1995 | Alfaro et al. |
| 5,471,011 A | 11/1995 | Maslakow |
| 5,585,669 A | 12/1996 | Venambre |
| 5,611,129 A | 3/1997 | Yoshimoto et al. |
| 5,824,177 A * | 10/1998 | Yoshihara et al. .......... 156/250 |
| 5,874,321 A | 2/1999 | Templeton, Jr. et al. |
| 6,282,781 B1 * | 9/2001 | Gotoh et al. ................... 29/841 |
| 6,321,444 B1 | 11/2001 | Yatsuda |
| 6,428,650 B1 * | 8/2002 | Chung ........................ 156/250 |

FOREIGN PATENT DOCUMENTS

| | | | |
|---|---|---|---|
| EP | 0 643 482 A1 | 3/1995 | |
| EP | 0 803 901 A2 | 10/1997 | |
| EP | 0 911 965 A2 | 4/1999 | |
| JP | 01188349 A * | 7/1989 | .............. B41J/3/04 |
| JP | 2000106520 A * | 4/2000 | ............ H03H/9/64 |

OTHER PUBLICATIONS

"New packaging technology for SAW device", Ando, D.; Oishi, K.; Nakamura, T.; Umeda, S.; Yuzawa, T.; Electronic Manufacturing Technology Symposium, 1995, Proceedings of 1995 Japan International, 18th IEEE/CPMT International, Dec. 4–6, 1995, Pages(s): 403–406.*

* cited by examiner

*Primary Examiner*—Paul D Kim
(74) *Attorney, Agent, or Firm*—Allen, Dyer, Doppelt, Milbrath & Gilchrist, P.A.

(57) ABSTRACT

An assembly and method for array processing of hermetically sealed Surface Acoustic Wave (SAW) Devices employs a non-conductive material having an array of spaced cavities extending into the material for receiving a SAW die face down, in a flip-chip arrangement. Each cavity has a peripheral recess dimensioned to receive a lid for hermetically sealing the die within the cavity. Conductive paths are provided from the interior of the cavity to the surface of the array for providing an electrical contact with the SAW die. Individual SAW devices are then provided by cutting along separation lines between adjacent cavities after a plurality of die have been hermetically sealed within its cavity.

10 Claims, 3 Drawing Sheets ent invention is directed to a system and method
METHOD FOR ARRAY PROCESSING OF SURFACE ACOUSTIC WAVE DEVICES

CROSS-REFERENCE TO RELATED APPLICATION

This application claims priority to commonly owned provisional application Ser. No. 60/209,692, filed Jun. 6, 2000.

FIELD OF THE INVENTION

The present invention relates generally to techniques for processing and encapsulating microelectronic components, and specifically relates to systems and methods for efficiently packaging surface acoustic wave devices.

BACKGROUND OF THE INVENTION

Surface acoustic wave (SAW) devices are used in a broad range of RF and IF applications, including wireless communication and cable television. Because the acoustic wave propagates at the surface of the piezoelectric die in SAW devices, the performance of the device can be affected by the environment to which the die is exposed. To avoid such exposure, it is desirable to seal SAW dies inside hermetic packages. In recent years, SAW packages have been fabricated from ceramic and hermetically sealed with metal or ceramic lids using seam welding, solder reflow, or glass frit sealing techniques.

Recent advances in SAW technology, particularly for applications in wireless communications, require smaller SAW devices. While a few years ago it was common for SAW filters used in mobile phone handsets to exceed 12 millimeters in length, such devices are now (in many cases) only a few millimeters long. This miniaturization of SAW filters is likely to continue for some time.

With moderate to large packages, manufacturing using singulated packages that are mechanically fixtured in carriers is feasible. The processes of die attach, wire bond, and lid attachment can all be automated using conventional techniques. As package size shrinks, however, the fixturing and handling of singulated packages and lids becomes more difficult and inefficient. To enhance the manufacturability of such small packages, SAW device manufacturers are developing techniques for processing SAW packages in monolithic ceramic arrays that contain many (often 300 or more) packages per array. The array serves as a base for die attach and formation of electrical connections to the die (whether through wire bonding, flip chip, or other techniques). While the techniques for attaching and interconnecting SAW die to arrays are well understood, the methods for attaching lids to these arrays are very limited.

It would appear from the construction of prior art devices that some SAW manufacturers are using cupped ceramic lids attached to the SAW packages using an insulating resin (B-staged epoxy, byway of example). One can manufacture such devices by aligning and placing the cupped ceramic lids over each die on a heated array. The seal surface of the lids is coated with the B-staged epoxy prior to assembly on the array. The array is designed with a clearance between the lids for subsequent singulation operations. The use of a B-staged epoxy allows the lids to be placed in close proximity to each other without the need for physical barriers or aligners between consecutive lids. The tacky, viscous nature of the heated, B-staged epoxy holds the lids in place prior to final cure and helps prevent the resin from wicking between consecutive lids. Unfortunately, such resin sealing techniques are inherently non-hermetic and allow certain gases (especially water vapor) to permeate through the package seal.

Typically, hermetically sealed SAW filter packages are usually fabricated with a solder sealed flat metal lid. Unfortunately, there currently are no effective methods for placing and fixturing small solder lids onto arrays prior to and during reflow. SAW device manufacturers utilizing solder sealing techniques are doing so with discrete, singulated packages and lids. In most cases, the solder lids are externally fixtured onto the singulated packages and reflowed in inert atmosphere ovens without the use of solder flux. The tacky nature of solder flux is often used to help hold electronic components in place during reflow. However, SAW devices are extremely sensitive to foreign materials on the surface of the electrodes. The residue from the flux can become trapped in the sealed package after reflow and can deposit on the active surface of the SAW die.

In contrast to singulated package solder sealing, the technique of externally fixturing solder lids onto an array is very difficult to accomplish due to the small dimensions of the lids, the limited clearance between packages on the array, and the camber of the array. In addition, it is difficult to maintain integrity between the external fixture and the array during reflow. The external fixture must be aligned precisely and held in intimate contact with the entire array during the reflow process in order to effectively isolate the thin lids and prevent the solder from bridging between lids. The present invention alleviates all of the difficulties associated with lid fixturing and package sealing encountered in the current art.

SUMMARY OF THE INVENTION

The present invention is directed to a system and method permitting array processing of surface acoustic wave devices and other microelectronic components. The preferred method of the present invention comprises the steps of (a) forming a unitary array of a nonconductive material having opposing first and second surfaces and plural spaced cavities extending into the array from the first surface, each cavity dimensioned to receive a SAW die therein; (b) forming a recess at each cavity adjacent the first surface, each recess having a width greater than the corresponding cavity and dimensioned to receive a lid within the recess; (c) providing at least two conductive paths from the interior of each cavity to a surface of the array; (d) inserting a SAW die into each of a plurality of the cavities, each SAW die having conductive means electrically contacting the conductive paths within the interior of the corresponding cavity after insertion; (e) sealing a lid in the recess over each inserted SAW die; and then (f) separating the array into individual SAW devices along separation lines between adjacent cavities.

Another important aspect of the present invention is the ability to maintain spacing between adjacent cavities after the separating step. This may be achieved by applying tape means over the sealed lids and the first surface.

The present invention also comprises surface acoustic wave devices manufactured according to the methods described above. Those devices are formed from an assembly comprising the unitary array with cavities and recesses as described above, and with a SAW die inserted into each one of a plurality of the cavities in electrical contact with conductive paths extending from the interior of the corresponding cavity to a surface of the array. After the sealing of a lid in each respective recess over the inserted SAW die, the array is separated into individual SAW devices.

It is an overall object of the present invention to provide a lid fixturing technique that, when integrated into the package, allows for the hermetic sealing of ceramic SAW packages in an array format while also providing adequate clearance between package sites for subsequent singulation. The packages are preferably sealed with solder although other sealants may be used. The walls of the recess contain the lids during handling and prevent solder from bridging between lids during reflow. Suitably, the recess is the same thickness as the lids. Preferably, the recess is an integral part of the package and provides a ceramic "picture frame" on top of a package layout. As a result, the lids can be placed precisely onto each package site with an off-line, automated placement machine and without the need for an external fixturing apparatus.

In order to seal the lids, a matrix of free-floating weights or a flat plate is placed on top of the lids in the array and the assembly is placed in an inert atmosphere oven for subsequent reflow. The inherent fixturing capabilities of the "picture-frame" recesses, in conjunction with a slightly expanded array layout, allows for the solder sealing of small footprint, multilayer ceramic SAW packages in an array format, while providing adequate clearance between package sites for subsequent singulation by dicing between adjacent cavities.

The solder sealing technique may use solder coated, solder clad, and solder preform metal or ceramic lids. While solder sealing is the sealing method of choice, resin sealing and glass frit sealing may also be used. The sealing media (resin, glass, or solder) may be an integral part of the lid, an integral part of the package array, or applied to the package or lid prior to assembly.

BRIEF DESCRIPTION OF THE DRAWINGS

FIG. 4 is a perspective illustration of an encapsulated surface acoustic wave device in accordance with the present invention.

DETAILED DESCRIPTION

A system and method for array processing of surface acoustic wave devices in accordance with this invention will now be described with reference to FIGS. 1–4.

Figure 1:
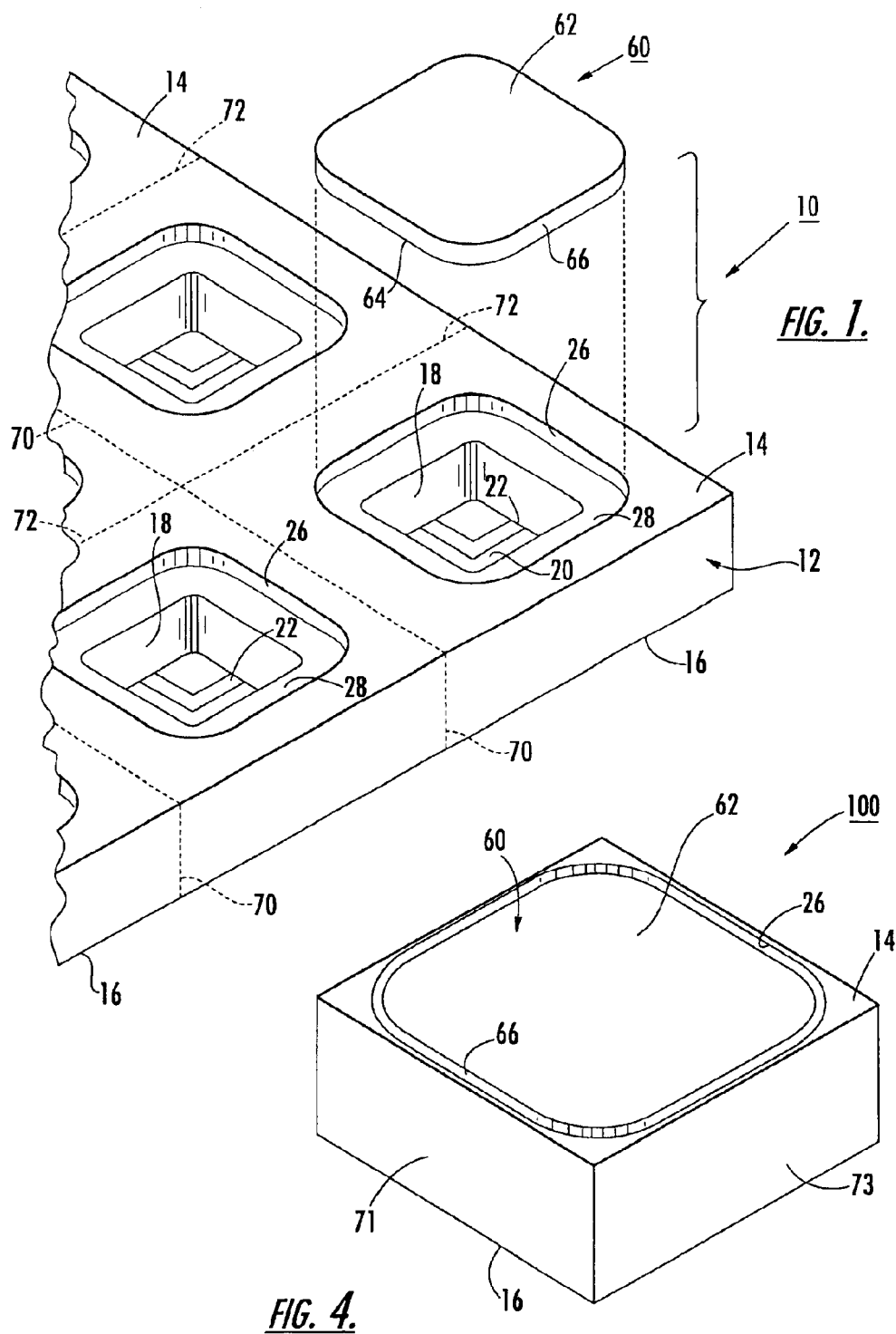
FIG. 1 is a perspective view, partially cut away, of a portion of an assembly used in the method of the present invention.

In FIG. 1, the assembly used in practicing the method is referred to generally with reference numeral 10. The assembly 10 includes an array formed in a ceramic body 12 having an upper surface 14 and a lower surface 16. The array includes plural cavities 18, each extending into the ceramic body 12 from the upper surface 14 to a cavity bottom 20. As thus configured, there is a small dimension of the ceramic body 12 between the cavity bottom 20 and the second surface 16 (note the cross-section of FIG. 3).

The assembly is provided with at least two conductive paths extending from the interior of each cavity 18 to a surface of the ceramic body 12. As shown in FIGS. 1–4, these conductive paths are provided by conductive layers 22, 24 on the bottom 20 of the cavity 18, which are respectively electrically connected to conductive vias 30, 34 extending through the ceramic body 12 and terminating in respective contact pads 32, 36 along the second surface 16. Conductive via 34 also extends into contact with an overlap area 28 and in contact with the lid solder 63, as shown in FIG. 3 and described in greater detail below.

In accordance with the present invention, a lid alignment recess 26 is formed in the body 12 at each cavity 18 adjacent the first surface 14, with each recess having a width and length which is greater than the corresponding cavity 18 and being dimensioned to receive a lid 60 within the recess. The recess 26 thus defines an overlap area 28 which is in contact with solder 63 on the lower surface of the lid 16 after the lid is placed in the recess, as shown in FIG. 3.

Figure 2:
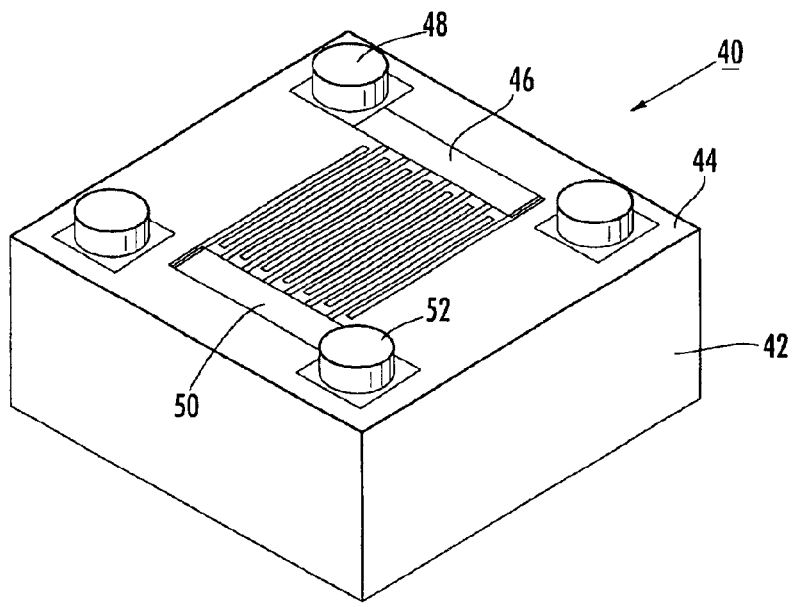
FIG. 2 is a perspective illustration of a typical ball bonding of flip chip surface acoustic wave (SAW) die.
Figure 3:
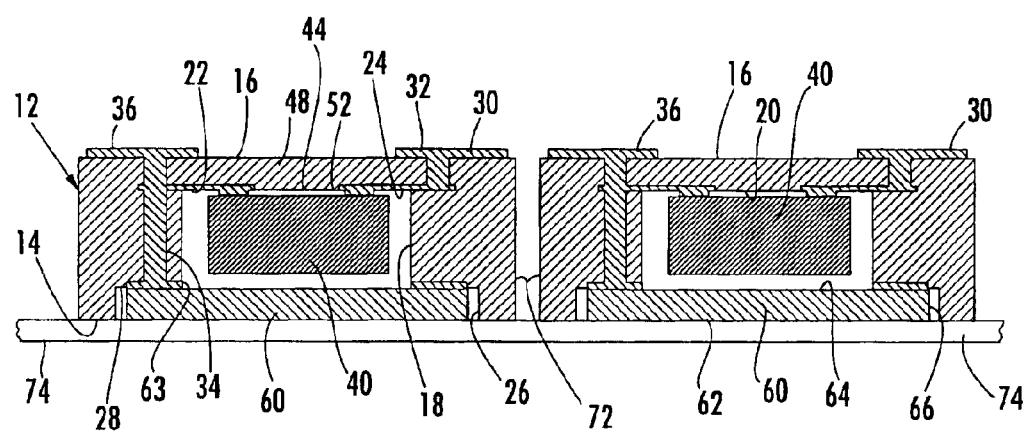
FIG. 3 is a cross-sectional view of a portion of the assembly of the present invention, at a point following separation of the array into individual SAW devices along separation lines, and while spacing between individual arrays is being maintained.

Reference is now made to FIG. 2, which illustrates a typical surface acoustic wave (SAW) die 40 formed in a piezoelectric body 42 having an upper surface 44 onto which are deposited a first set of interdigitated electrodes 46 with associated bond pad 48 and a second set of interdigitated electrodes 50 with associated bond pad 52. As shown in FIG. 3, during processing, the SAW die 40 is oriented in the cavity 18 with the bond pads 48, 52 in respective contact with the conductive layers 22, 24 in a typical "flip-chip" arrangement. It will of course be understood by one skilled in the art from the discussion set out below that the cross-section of FIG. 3 illustrates the assembly after bonding, so as to fix the SAW die 40 in place before the assembly 10 is inverted for separation of individual components and testing.

Referring again to FIG. 1, after the SAW die 40 is placed in the cavity 18 the lids 60 are then placed over the cavities 18 in the lid alignment recesses 26 and in contact with the overlap area 28. Preferably, this is achieved using automated equipment.

Figure 5:
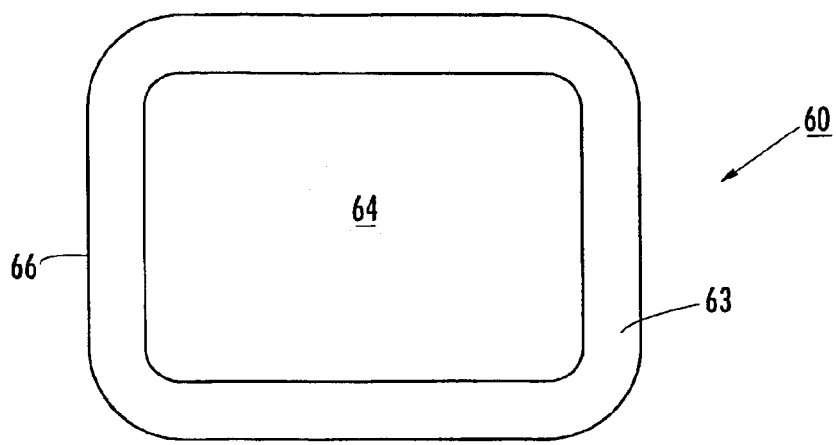
FIGS. 5 and 6 are bottom and side views, respectively, of a first solder configuration for lids useful with the assembly of the present invention.
Figure 6:
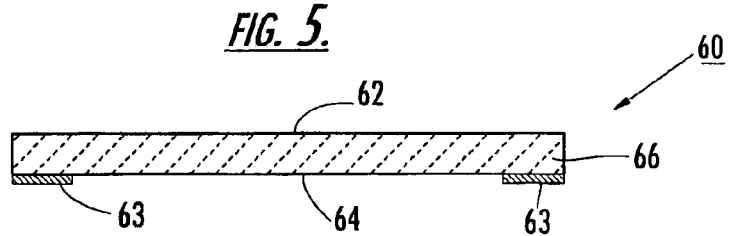
Figure 7:
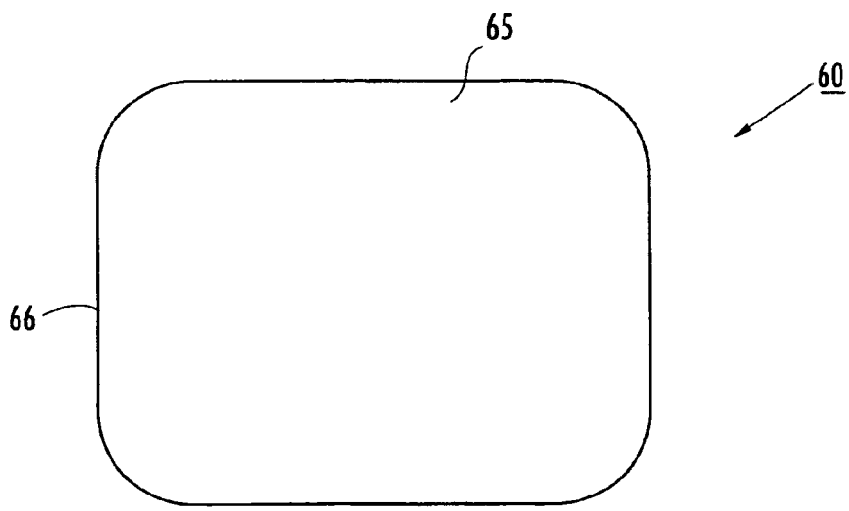
FIGS. 7 and 8 are bottom and side views, respectively, of a second solder embodiment for the lid of the present invention.
Figure 8:
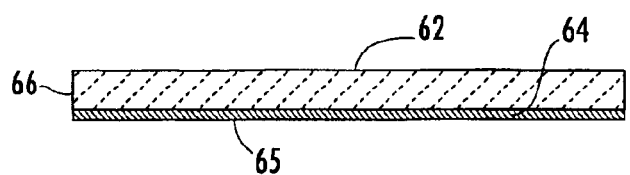

Referring now to FIGS. 5–8, there is shown two different examples of suitable solder configurations for the lid 60. In FIGS. 5 and 6, the solder joint 63 is restricted to the peripheral area of the bottom surface 64 and corresponds to the overlap area 28 (FIG. 1). In the arrangement shown in FIGS. 7 and 8, the solder joint 65 is applied as a continuous layer over the entire bottom surface 64 of the lid 60. The embodiment of FIGS. 5 and 6 is depicted in the cross-sectional view of FIG. 3. During processing, the lids 60 are held firmly in place within the respective lid alignment recesses 26 using free-floating weights or a flat plate placed on top of the lids in the array, while being subjected to heat in an inert atmosphere in order to cause the solder joint 63 to flow.

After the reflow step discussed above, means are applied to the bottom surface 16 of the ceramic body 12 to maintain the integrity of the array during separation of individual SAW devices along separation lines 70, 72. In a preferred arrangement, this means comprises a tape 74 applied across the first surface 14 and the top surface 62 of the lids 60. Preferably, the array is "singulated" (i.e., rendered into individual components) via dicing saw or another suitable separation technique along the separation lines 70, 72. Thereafter, the tape 74 is removed to permit further handling of the individual SAW devices 100.

As shown in FIG. 4, the resulting singulated SAW device 100 comprises a portion of the ceramic body 12 and its associated upper and lower surfaces 14, 16 and side surfaces 71, 73 which are formed from respective separation lines 70, 71. The lid 60 is hermetically sealed within the lid alignment recess 26. It will of course be appreciated by those skilled in the art that the SAW device 100 is capable of significant miniaturization relative to prior art devices.

This concludes a description of this invention. It will be apparent to those skilled in the art that various modifications can be made to these embodiments without departing from the spirit and scope of the present invention. For example, while a ceramic array has been described, other materials may be suitable as an array material. Further, as described above, resins and glass frit may be employed as suitable sealing materials. Likewise, other suitable arrangements may be employed to accomplish the objective of the alignment recess.

That which is claimed is:

1. A method for manufacturing an array of hermetically sealed surface acoustic wave (SAW) devices, the method comprising the steps of:

forming a unitary array of a material having opposing first and second surfaces and a plurality of spaced cavities extending into the array from the first surface;

forming a recess from the first surface around selected cavities;

providing at least two conductive paths from within each selected cavity to at least one of the first and second surfaces of the array;

inserting and attaching a SAW die face down, in a flip-chip arrangement, into at least some of the selected cavities, each SAW die having conductive means electrically contacting the at least two conductive paths within the corresponding cavity;

solder sealing a metal lid in the recess over the inserted SAW die for hermetically sealing the SAW die within the cavity; and then separating the array into individual SAW devices along separation lines between adjacent cavities.

2. The method recited in claim 1, further comprising the step of maintaining spacing between adjacent cavities during the separation step by applying tape means over the sealed lids and the first surface.

3. The method recited in claim 1, wherein the solder sealing step comprises the steps of:

placing the lid over at least some of the plurality of spaced cavities;

placing solder about a periphery of each lid; and then treating the array having the lids and solder thereon so as to hermetically seal each lid thereto.

4. The method recited in claim 3, wherein the treating step comprises heating the array to effectuate sealing of the lids.

5. The method recited in claim 1, further comprising the steps of:

placing a continuous tape across the first surface and the sealed lids prior to the separating step;

undertaking the separating step from the second surface while maintaining continuity of the tape across the first surface; and then removing the individual components from the tape.

6. The method recited in claim 1, further comprising the step of forming the unitary array from a non-conductive material.

7. The method recited in claim 6, wherein the unitary array comprises a ceramic.

8. The method recited in claim 1, wherein the lid sealing step comprises the step of hermetically sealing the cavity from an ambient environment.

9. An assembly for manufacturing individual surface acoustic wave (SAW) devices comprising:

a unitary array of a nonconductive material having opposing first and second surfaces and a plurality of spaced cavities extending into the array from the first surface;

a SAW die carried face down, in a flip-chip arrangement, within at least some of the plurality of spaced cavities;

a recess formed around selected cavities extending from the first surface, at least two electrically conductive paths from the SAW die within each selected cavity to an at least one of the first and second surfaces of the array;

a lid solder sealed in each recess of the selected cavities over the inserted SAW die for hermetically sealing the die therein; and wherein the array is separated along separation lines between adjacent cavities to form individual SAW devices therefrom.

10. The assembly recited in claim 9, wherein each recess has a dimension greater than that of the corresponding cavity in order to form an area of overlap, and wherein the lid sealed in each recess engages the area of overlap.

* * * * *